United States Patent [19]
Davis

[11] 4,082,075
[45] Apr. 4, 1978

[54] INPUT QUARTER CYCLE TIMING CIRCUIT

[75] Inventor: William F. Davis, Tempe, Ariz.

[73] Assignee: Motorola, Inc., Schaumburg, Ill.

[21] Appl. No.: 662,052

[22] Filed: Feb. 27, 1976

[51] Int. Cl.$^2$ ............................................. F02P 1/00
[52] U.S. Cl. ................................ 123/148 E; 307/269
[58] Field of Search ..... 123/148 E, 148 CB, 148 CA; 307/269, 315, 293, 294

[56] References Cited

U.S. PATENT DOCUMENTS

| | | | |
|---|---|---|---|
| 3,011,072 | 11/1961 | Gerlach | 307/269 |
| 3,474,263 | 10/1969 | Kalb | 307/269 |
| 3,892,219 | 7/1975 | Preiser et al. | 123/148 E |
| 3,923,029 | 12/1975 | Polo | 123/148 E |

*Primary Examiner*—Samuel Feinberg
*Attorney, Agent, or Firm*—Michael D. Bingham

[57] ABSTRACT

A timing circuit suitable for providing an output signal which occurs at the initiation of a negative going input signal and remains for a fixed percent duration of the period of the input signal. The timing circuit includes an input latch circuit for preventing any false output signal which might otherwise occur during the duration of the output signal because of input noise transients. The timing circuit is suitable to be provided in electronic ignition systems.

14 Claims, 3 Drawing Figures

INPUT QUARTER CYCLE TIMING CIRCUIT

CROSS-REFERENCE TO A RELATED APPLICATION

The subject matter of the subject invention is related to the subject matter disclosed in U.S. Pat. No. 4,041,912 entitled, "Solid State Ignition System and Method for Regulating the Dwell Time Thereof" by Douglas C. Sessions, issued Aug. 16, 1977 which is assigned to Motorola, Inc.

BACKGROUND OF THE INVENTION

This invention relates to circuits for producing, in response to an input signal, an output signal of a predetermined percent time duration of the period of the input signal. More particularly, the invention relates to a circuit suitable to be utilized as an integrator circuit for use in solid state ignition systems.

It has been recognized that present day mechanical ignition systems for automobiles or the like cannot meet future requirements for low level pollutant emission from combustion engines especially for long durations of operation. It has also been recognized that solid state ignition systems can be utilized to electronically control ignition firing to reduce both wasting of fuel and pollution caused by internal combustion engines for long periods of operation.

Many prior art solid state ignition systems have been proposed for internal combustion engine vehicles. Some prior art ignition systems employ at least one integrating circuit for producing, in response to timing signals generated in timed relationship to the engine, a control signal for charging and discharging the ignition coil at the required time to maintain firing in the engine. At least one prior art system charges and discharges an integrating capacitor at predetermined charging and discharging rates to produce an output signal which is of a predetermined percent time duration of the period of the input signal. Moreover, the initiation of the output signal occurs as the magnitude of successive timing signals cross a zero axis in a positive sense. One important function of the output signal is to positively inhibit charging of the ignition coil during the time duration of ignition coil discharge so to prevent false firing in the engine due to an undesirous input noise signal which can occur during the engine firing cycle.

The above prior art solid state ignition circuit employs an integrating capacitor connected between two reference points to provide the output signal discussed above. Because the ignition system is typically placed under the hood of automobiles or the like, the circuit employing a capacitor connected between two reference points is susceptible to noise transients produced during the normal operation of the engine, since these noise transients could be either inductively or capacitively coupled to the capacitor, a false signal could occur to charge the ignition coil during the firing cycle. If a false signal should be generated, false firing could occur during the firing cycle which could damage or at least seriously degrade the engine's performance.

Therefore, a need exists to provide a solid state ignition system comprising an integrator or timing circuit which utilizes a capacitor but is not susceptible to inductively or capacitively coupled noise transients produced by an internal combustion engine.

SUMMARY OF THE INVENTION

Accordingly, it is an object of the present invention to provide an improved timing circuit.

It is another object of the invention to provide a timing circuit which, in response to an input signal, produces an output signal for a predetermined percent time duration of the period of the input signal.

It is a further object of the invention to provide a timing circuit suitable to be utilized in solid state ignition systems.

A still further object of the present invention is to provide a percent-of-an-input-period timing circuit suitable to be employed as an integrator circuit for solid state ignition systems.

In accordance with the present invention, a timing circuit is disclosed for producing, in response to an input signal, an output signal which is of a predetermined percentage of the period of the input signal which comprises a capacitor having one terminal thereof coupled to a ground reference terminal; a first circuit which is coupled to the capacitor and is responsive to the applied input signal to discharge the capacitor at a first predetermined rate during a portion of the input signal; and a second circuit responsive to another portion of the applied input signal's period for charging the capacitor at a second predetermined rate. A third circuit is responsive to the full discharge of the capacitor for preventing any noise transients, which may be coupled to the capacitor, from generating a false output signal.

DETAILED DESCRIPTION OF THE PREFERRED EMBODIMENT

Figure 1:
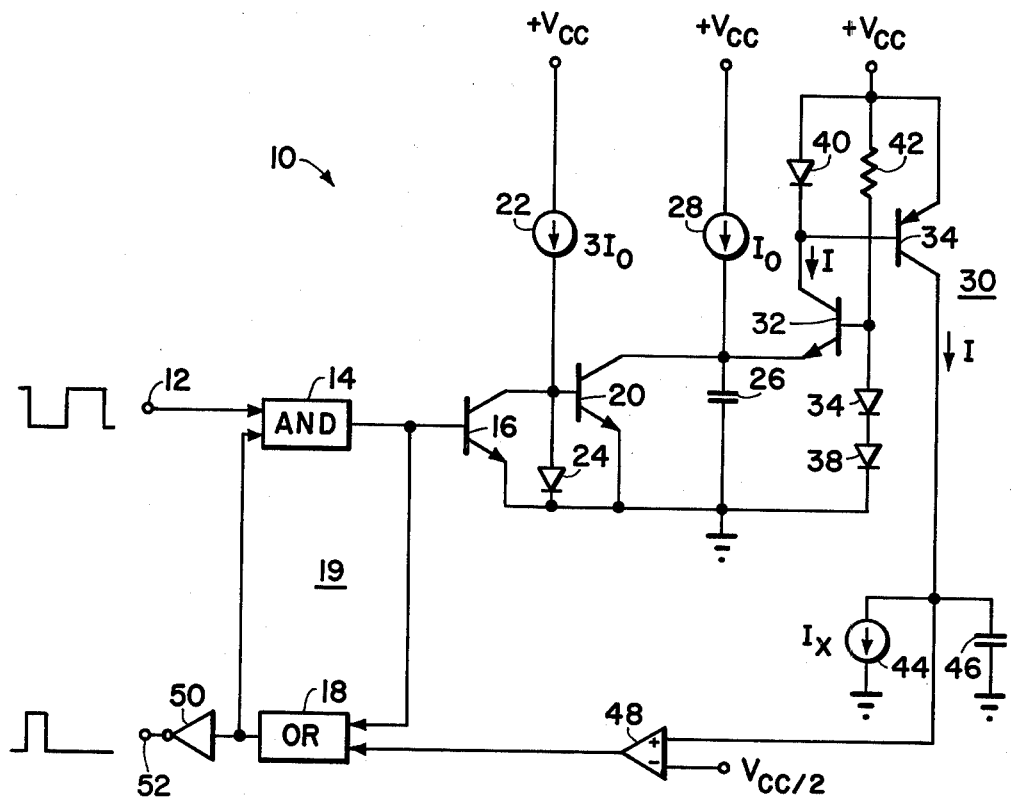
FIG. 1 is a partial block and schematic diagram illustrating a timing circuit of the embodiment of the invention.

Referring to FIG. 1, there is shown in block and schematic diagram, timing circuit 10 of an embodiment of the invention. Timing circuit 10 is adapted to receive an input signal of a given duty cycle at input terminal 12 which is connected to a first input terminal of AND gate 14. The output of AND gate 14 is coupled to the base electrode of transistor 16 and one input terminal of OR gate 18. AND gate 14 and OR gate 18 comprise an input latch circuit 19 which is known in the art and will be briefly described hereinafter. The collector electrode of transistor 16 is coupled to the base electrode of transistor 20 and through a constant current source 22 to a positive supply terminal. The emitter electrodes of transistor 16 and transistor 20 are coupled to a ground reference terminal of timing circuit 10. Diode 24 is coupled between the collector of transistor 16 and the ground reference terminal. The combination of diode 24 and transistor 20 form a mirror circuit well known in the art. The collector electrode of transistor 20 is coupled to one plate of integrating capacitor 26 which has its other plate connected to the ground reference terminal. The first plate of integrating capacitor 26 is also coupled through constant current source 28 to the positive power supply. Clamping circuit 30 comprising transistors 32 and 34, diodes 34, 38 and 40, and resistor 42 is provided for clamping the magnitude to which integrating capacitor 26 discharges to a predetermined voltage level and provides a signal to voltage comparator 48 during the clamping as will be explained later. Clamping circuit 30 is coupled to the first plate of integrating capacitor 26 at the emitter electrode of transistor 32 and has an output current node taken at the collector of transistor 34. Coupled between the collector electrode of transistor 34 and the ground reference terminal is constant current source 44 which has filter capacitor 46 connected in parallel thereto. Differential comparator circuit 48 has the noninverting input terminal thereof connected to the collector electrode of transistor 34 and the inverting input thereof connected to a reference voltage. The output of differential comparator 48 is connected to another input terminal of OR gate 18 which has an output connected to a second input of AND gate 14 and to the input of inverter 50. As will be explained in greater detail, the output monopulse signal from timing circuit 10 is produced at the output of inverter 50.

Figure 2:
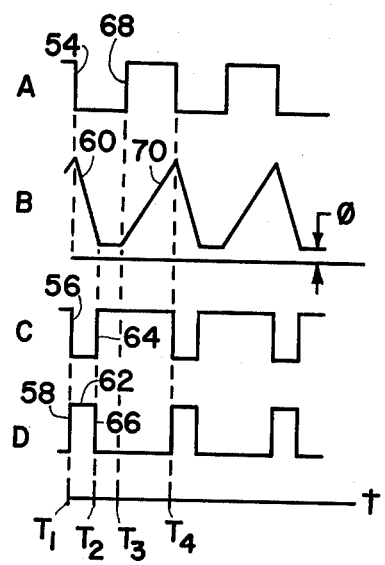
FIG. 2 illustrates waveforms which are useful in understanding the operation of the embodiment of the invention.

Referring to FIGS. 1 and 2, the operation of the embodiment of FIG. 1 will be explained. For explanation purposes it will be assumed that timing circuit 10 has been in operation prior to time $T_1$ (FIG. 2) such that waveform 2A, which corresponds to the input signal, is at a positive level. Prior to time $T_1$ a further assumption is made that the second input to AND gate 14 is at a logic 1 and thus the output of AND gate 14 is a logic 1 and transistor 16 is in a conductive state. With a logic 1 at the output of AND gate 14 the output of OR gate 18 will be at a logic 1 which is presented to the second input of AND gate 14 making the aforementioned assumption valid, and causes the output of inverter 50 at terminal 52 to be at a low state (waveforms 2D and 2C, respectively). With transistor 16 conducting, transistor 20 is biased in an off condition which causes capacitor 26 to be charged by constant current source 28 at a ramp rate proportional to the current magnitude therefrom. Waveform 2B illustrates the ramping of capacitor 26 at portion 70 having a slope of $I_O/C26$. As long as the voltage magnitude across capacitor 26 is greater than the voltage magnitude of one diode drop, clamping circuit 30 will be rendered nonconducting. With clamping circuit 30 in a nonconductive state, capacitor 46 is caused to discharge to a ground level potential by constant current source 44 which causes a logic 0 to be applied at the noninverting input terminal of differential comparator 48. This produces a logic 0 at output of comparator 48.

At time $T_1$, the input signal, waveform 2A, is caused to switch to a 0 level. The output of AND gate 14 will correspondingly be switched to a logic 0 as does the output of OR gate 18, portion 56 of waveform 2C since output of comparator 48 is also a logic 0. With the input to inverter 50 being at a logic 0, the output at terminal 52 goes positive as illustrated by portion 58 of waveform 2D. Transistor 16 is rendered nonconductive, and in response thereto, diode 24 is rendered conductive. The current from constant current source 22 having a magnitude, $3I_O$, flows through diode 24 which causes the same magnitude of current to be conducted through transistor 20. Because constant current source 28 can only provide a current magnitude of $I_O$, capacitor 26 is caused to discharge at a rate proportional to a current of $2I_O$, this is illustrated by portion 60 of waveform 2B which has a slope of $2I_O/C26$. Capacitor 26 will continue to discharge at a rate proportional to $2I_O$ until time, $T_2$. As clamping circuit 30 is maintained in an off condition during time intervals $T_1$ through $T_2$, the voltage supplied to noninverting input terminal of comparator 48 is maintained at ground reference level and latch circuit 19 is latched to produce a logic 0 at the second input of AND gate 14 and a logic 1 state at terminal 52. Thus, the output of timing circuit 10 remains high, (portion 62) for time interval $T_1$ to $T_2$ independent of the input signal since a logic 0 is latched at the second input of AND gate 14. The time interval, $T_1$–$T_2$, corresponds to a fixed percentage of the input period (time interval $T_1$ through $T_4$).

Capacitor 26, being grounded at one terminal thereof provides for filtering any noise transients of short duration which might be coupled from the input of timing circuit 10 thereto during the time interval $T_2$–$T_4$. Thus, timing circuit 10 is not susceptible to input noise transients during the time interval $T_1$–$T_2$ due to latch circuit 19. Moreover, during time interval $T_2$–$T_4$, due to capacitive filtering, timing circuit 10 inhibits any false output signal at terminal 52 from appearing. Furthermore, capacitor 26 will also filter transient voltages which might be either inductively or capacitively coupled to this capacitor during the entire time period, $T_1$–$T_4$, since one end thereof is referenced to ground.

Transistor 32 of clamping circuit 30 is biased between the operating potential $V_{cc}$ and ground by the biasing network comprising resistor 42 and diodes 34 and 38. Transistor 32 is biased in an off condition until the voltage at the emitter thereof falls to one diode voltage drop or as illustrated in FIG. 2B the magnitude, $\phi$. This results since the voltage drop of diode 34 will match the emitter to base voltage drop of conducting transistor 32 causing the diode drop of diode 38 ($\phi$) to appear across capacitor 26 when clamped. Thus, at $T_2$, the magnitude of the voltage across transistor 26 reaches the predetermined voltage potential $\phi$ and transistor 32 of clamping circuit 30 begins to conduct. The collector current of transistor 32 approaches a magnitude $2I_O$ when capacitor 26 is fully clamped or is no longer discharged. Diode 40 and PNP transistor 34 of clamping circuit 30 comprise a PNP turnaround circuit known in the art such that the current supplied at the collector electrode of transistor 34 is also of a magnitude $2I_O$. The current flowing through transistor 34 being greater than the magnitude of current supplied by constant current source 44 ($I_X$) causes capacitor 46 to charge at another predetermined rate, but generally fast with respect to slopes 60 or 70 of waveform 2B. Thus, at time $T_2$, the magnitude of voltage across capacitor 46 becomes substantially equal, in short time, to the reference voltage supplied at the inverting terminal of differential comparator 48 and a logic 1 appears at the output thereof. In response to a logic 1 appearing at an input terminal thereof, OR gate 18 changes states and a logic 1 appears at the output thereof, portion 64 of waveform 2C. The output of timing circuit 10 then switches to a low state, portion 66, in response to OR gate 18 changing output levels. During time interval $T_2$–$T_3$ capacitor 26 acts as a filter to noise at the input or noise inductively or capacitively coupled to the capacitor 26. In addition, for short duration transients on capacitor 26, capacitor 46 would keep the voltage at noninverting input of comparator 48 in the high state due to the integration of noise signals by capacitor 46. At time $T_3$ the input signal switches to a positive level, portion 68 of waveform 2A, and because both input terminals of AND gate 14 are now at a logic 1 level, the output of AND gate 14 changes to a logic 1 and transistor 16 is again rendered conductive. With transistor 16 in a conductive condition, transistor 20 is biased off and capacitor 26 begins to charge at a rate proportional to the current magnitude, $I_O$, portion 70 of waveform 2B. At time $T_4$, when the input signal again switches to a "0" state the above cycle repeats.

Thus, what has been described is a timing circuit which in response to an input signal, of a given duty cycle, produces an output signal only during a fixed percentage of the input signal's period independent of the input signal due to an input latch circuit. During the time $T_2-T_3$ any noise transients which might be capacitively or inductively or input coupled to timing circuit 10 are filtered to ground not only by capacitor 26 but also by capacitor 46. Furthermore, during the time $T_3-T_4$, capacitor 26, when being charged at a rate porportional to the current magnitude $I_O$, filters to ground transient voltages which may be inductively or capacitively or input coupled to circuit 10. Thus, timing circuit 10 is not susceptible to noise transients which might be coupled thereto as some prior art timing circuits are that which use a capacitor connected between two reference terminals instead of the grounded capacitor 26 of timing circuit 10.

Figure 3:
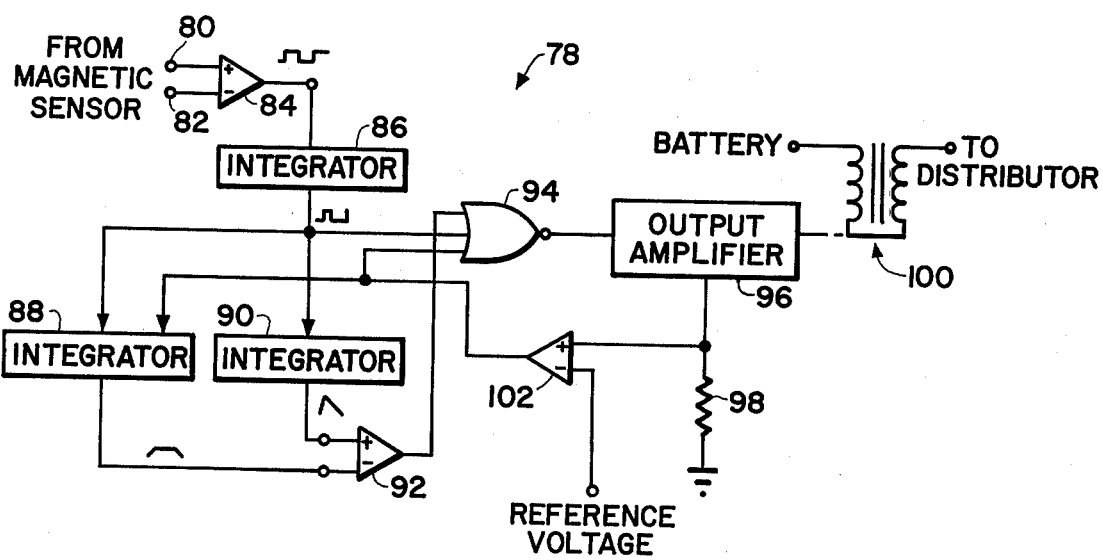
FIG. 3 is a partial block and schematic diagram of a solid state ignition system which may employ the embodiment of FIG. 1.

Referring to FIG. 3, there is shown a solid state ignition system 78 in which timing circuit 10 may be employed. A detailed description of solid state ignition system 78 is provided in U.S. Pat. No. 4,041,912 referenced above. A brief discussion of ignition system 78 follows hereinafter.

Timing signals having generally a sinusoidal shape, with positive and negative portions, are produced in timed relationship with the engine in a well known manner. These timing signals are differentially applied to the input terminals 80 and 82, respectively, of differential comparator 84. It is desired that in response to the sinusoidal timing signals crossing the zero axis in a positive sense that a spark potential be produced to cause firing in the engine of an automobile or the like as will be explained later.

The output of differential comparator 84 is connected to the input of integrator 86 which in the present case would be timing circuit 10 of FIG. 1. It is to be understood that an inverter may be included between comparator 84 and integrator circuit 86 to invert the signal applied to integrator circuit 86. In this way, in response to the timing signals crossing the zero axis in a positive direction, the input pulse to integrator circuit 86 switches from a high state to a low state as is illustrated by waveform 2A at time $T_1$. The output of integrator 86 is applied to integrator circuit 88, integrator 90, and one input of NOR gate 94. The outputs of integrators 88 and 90 are applied to comparator 92 the output of which is connected to a second input gate of NOR gate 94. The output of NOR gate 94 is coupled to amplifier 96 which is connected in series between ignition coil 100 and sensing resistor 98. Sensing resistor 98 is connected to the noninverting terminal of differential comparator 102 the output of which is connected to an input of integrator 90 and another input terminal of NOR gate 94. The inverting terminal of differential comparator 102 is coupled to a reference voltage which may be typically 200 mV.

For illustration purposes, it is assumed that the internal combustion engine is operating in a steady state condition, or at a constant RPM, so that the period of the engine firing cycle is constant. This cycle is not a complete cycle of the rotor of the distributor but represents the cycle required to produce each individual spark in the firing sequence of the operation of the engine. As illustrated, at the output of differential comparator 84, in response to each timing signal, a pulse train (FIG. 2A) is generated during the positive and negative half cycles, respectively, of each applied timing signal.

In response to the pulse train from comparator 84, a monopulse signal from $T_1-T_2$ is developed at the output of integrator 86 as discussed above in the operation of timing circuit 10. The output of integrator circuit 86 (which is applied to NOR gate 94) positively inhibits any output therefrom during the time period of which the monopulse signal is applied (from $T_1-T_2$) such that output amplifier 96 is prevented from being rendered conductive. Therefore, energizing current cannot be produced through the primary winding of ignition coil 100 during the time portion ($T_1-T_2$) of each firing cycle, independent of a noise induced input error signal. Thus, any noise signal produced at the end of a previous firing period does not cause the ignition circuit to energize the ignition coil during the high voltage transients of the spark. Simultaneously, the output pulse of integrator circuit 86 is applied to the inputs of integrators 88 and 90.

Integrator 90, which may include a timing circuit similar to that of FIG. 10, produces a reference signal at the output thereof in response to the application of the monopulse signal from integrator 86. In a manner well known in the art, an internal capacitor of integrator 90 may be charged during the time duration of the output from integrator 86 at a first predetermined rate and discharged during the remaining time of the firing cycle at a different predetermined rate such that at the beginning and end of each firing cycle the magnitude of the output signal from integrator 90 is at ground reference potential.

In response to the monopulse from integrator 86, integrator 88 which may also be a timing circuit similar to that described in FIG. 1, produces a variable threshold voltage at the output thereof. In a steady state condition, the magnitude of the threshold voltage would be constant.

In response to the applied monopulse from the integrator 86, the voltage across the internal integrating capacitor of integrator circuit 88 ramps up to the threshold voltage from a previously established reference potential. As discussed in detail in the aforementioned patent application, the reference potential is dependent on the time period of the previous firing cycle, being constant only during a steady state condition. The output from integrator circuit 88 will remain constant for a predetermined time period after which it begins ramping downward at the rate established by the discharge of the internal capacitor of the circuit.

The outputs from integrator circuits 88 and 90 are compared by comparator 92. When the magnitude of the output pulse from integrator circuit 90 is greater than the threshold potential appearing at the output of integrator circuit 88, the output from comparator 92 is at a logic 1 such that NOR gate 94 inhibits output amplifier 96 from being rendered conductive. However, at a predetermined time during some portion of the firing cycle, when the magnitude of the output from integrator circuit 90 becomes substantially equal to or less than the magnitude of the threshold potential occurring at the output of integrator circuit 88, the output of comparator 92 changes sense. Therefore, all of the inputs to NOR gate 94 are at a logic 0, and NOR gate 94 is enabled to thereby render output amplifier 96 conductive. In response thereto, energization current begins to flow through the primary winding of ignition coil 100, through amplifier 96 and sensing resistor 98 to ground. The output pulse from integrator 90 is caused to be returned to ground potential and integrator circuit 90 is returned to its initial state.

Amplifier 96 is caused to become saturated such that the energizing current produced therethrough rises at a rate most nearly determined by the L/R time constant of the primary winding of ignition coil 100. In response to the magnitude of the energizing current through the primary winding reaching a predetermined value, a current feedback loop comprising sensing resistor 98 and comparator 102 is rendered operative to produce an increasing inhibiting signal to NOR gate 94. As NOR gate 94 is inhibited, the drive signal to amplifier 96 is reduced such that current limiting is provided and no further increase of current is generated through amplifier 96. Simultaneously, the output signal from comparator 102 which is applied to another input of integrator circuit 88 causes discharge of the integrating capacitor included therein such that the threshold potential is decreased at a predetermined rate. At the beginning of the next firing time period, in response to the next applied timing signal being applied to the input of comparator 84, another monopulse will be generated at the output of integrator circuit 86 from $T_1$ to $T_2$. NOR gate 94 is again positively inhibited and amplifier 96 is rendered nonconductive. Subsequently, energization current through ignition coil 100 is abruptly ceased and the magnetic field collapses thereacross which produces a spark potential across the secondary winding of ignition coil 100 and ignition in the engine, as is understood. As explained in detail in the referenced patent application, the threshold potential established at the output of integrator circuit 88 can be varied in response to changes in the rpm of the engine to linearly regulate the dwell time to be a fixed percentage of the total firing cycle.

The embodiment of FIG. 3 which may include timing circuit 10 of FIG. 1 employed as integrator circuit 86 is not susceptible to noise transients produced during the operation of the engine which may otherwise cause false firing during an undesirable portion of the firing cycle. Thus, what has been described above is an electronic circuit for a solid state ignition system for providing sufficient spark potential in timed relationship to the engine and which is not susceptible to the noise transients produced during any portion of the input period.

Although timing circuit 10 of FIG. 1 has been shown to be included in a solid state ignition system and which may be fabricated in monolithic integrated circuit form, it is to be understood that timing circuit 10 may have other applications also. It is to be recognized that any application requiring an output signal to be produced which is of a predetermined time duration of a periodic input signal may include the embodiment of timing circuit 10 of FIG. 1. By varying the ratios of the currents supplied by constant current sources illustrated in FIG. 1, the time duration of the output signal may be varied to be any percentage of the input signal's period.

What is claimed is:

1. A timing circuit for producing an output signal the time duration thereof being a predetermined percentage of the period of an applied input signal, comprising:

capacitive means having first and second electrodes with said second electrode being connected to a ground reference terminal;

first circuit means coupled to said first electrode of said capacitive means for charging said capacitive means at a predetermined rate during a portion of the applied input signal;

second circuit means coupled to said first electrode of said capacitive means and the input of the timing circuit for discharging said capacitive means at a predetermined rate during another portion of the applied input signal including latch circuit means adapted to receive the input signal for producing first and second portions of a control signal corresponding to first and second time periods of the input signal, and switching circuit means responsive to said first portion of said control signal for discharging said capacitive means, said switching circuit means being responsive to said second portion of control signal to cause said capacitive means to be charged by said first circuit means;

third circuit means coupled to said first electrode of said capacitive means and to said second circuit means for producing the output signal only during the time that said capacitive means is being discharged;

said second circuit means further including:

a. first electron control means having first, second and control electrodes, said first electrode being connected to said ground reference terminal, said control electrode being coupled to said latch circuit means;

b. second electron control means having first and second electrodes, said first electrode being connected to said ground reference terminal, said second electrode being coupled to said second electrode of said first electron control means;

c. third electron control means having first, second and control electrodes, said first electrode being coupled to said ground reference terminal, said control electrode being coupled to said second electrode of said first electron control means, and said second electrode being connected to said first electrode of said capacitive means;

d. first constant current source means coupled to said second electrode of said first electron control means for supplying a first current of a predetermined magnitude; and e. said second electron control means being rendered nonconductive by said second portion of said input control signal from said latch circuit means such that said capacitive means is charged by said first constant current source means and said second electron control means being rendered conductive in response to said first portion of said input control signal from said latch means such that said capacitive means is discharged at said second predetermined rate.

2. The timing circuit of claim 1 wherein said first circuit means includes a first constant current source means for supplying a first current of a predetermined magnitude to charge said capacitive means at said predetermined rate.

3. The timing circuit of claim 1 wherein said third circuit means includes:

clamping circuit means coupled to said first terminal of said capacitive means for establishing a reference voltage having a magnitude to which said capacitive means is discharged thereto, said clamping means having an output terminal and being responsive only to the magnitude of the voltage across said capacitive means being substantially equal to or less than said reference voltage for producing a current at said output; and fourth circuit means coupled between said output of said clamping circuit means and said latch circuit means for producing the output signal only during the time duration said capacitive means is being discharged to said reference voltage.

4. The timing circuit of claim 3 wherein said fourth circuit means includes filter means for filtering noise transients which may be generated during the operation of the timing circuit during a predetermined portion of the time period of the applied input signal.

5. The timing circuit of claim 1 wherein said capacitive means filters undesirous noise transients during any predetermined portion of the time period of the input signal to prevent a false output signal from occurring during said predetermined portion of the input signal time period.

6. An ignition system including the timing circuit of claim 5 for charging and discharging, in response to timing signals generated in time relationship with the operation of an internal combustion engine, an ignition coil to produce spark potential to operate the engine, comprising in combination:

circuit means responsive to the timing signals for producing the input signal, said input signal being applied to the timing circuit;

circuit means responsive to the output signal produced at the output of the timing circuit for generating another control signal; and amplifier means coupled between said circuit means for producing another control signal and the ignition coil for charging and discharging the coil, said amplifier means being responsive to said another control signal for positively discharging the ignition coil to produce the spark potential.

7. The timing circuit of claim 1 wherein said third circuit means includes:

clamping circuit means coupled to said first terminal of said capacitive means for establishing a reference voltage having a magnitude to which said capacitive means is discharged thereto, said clamping means having an output terminal and being responsive only to the magnitude of the voltage across said capacitive means being substantially equal to or less than said reference voltage for producing a current at said output; and fourth circuit means coupled between said output of said clamping circuit means and said latch circuit means for producing the output signal only during the time duration that said capacitive means is being discharged to said reference voltage.

8. The timing circuit of claim 7 wherein said fourth circuit means includes filter means for filtering noise transients which may be generated during the operation of the timing circuit during any predetermined portion of the applied input signal.

9. An ignition system including the timing circuit of claim 1 for charging and discharging, in response to timing signals generated in time relationship with the operation of an internal combustion engine, an ignition coil to produce spark potential to operate the engine, comprising in combination:

circuit means responsive to the timing signals for producing the input signal which is applied to the timing circuit;

circuit means responsive to the output signal produced by the timing circuit for generating another control signal; and amplifier means coupled between said circuit means for producing another control signal and the ignition coil for charging and discharging the coil, said amplifier means being responsive to said another control signal for positively discharging the ignition coil to produce spark potential.

10. A timing circuit suitable to be fabricated in monolithic integrated circuit form and to being coupled to an external charge storage device for producing an output signal the duration of which remains a fixed percent of the period of an applied input signal when the period of the input signal is caused to be varied, comprising:

first circuit means responsive to the input signal being at a first level state for charging the charge storage device at a first predetermined constant rate;

second circuit means coupled to said first circuit means and being responsive to the input signal being at a second level state for discharging the charge storage device at a second predetermined constant rate;

third circuit means coupled to said first and second circuit means which is responsive to the charge storage device being discharged to a predetermined value for preventing further discharge of the same such that said predetermined value remains substantially constant during the remainder of the duration which the input signal remains in said second level state; and gate means coupled between said second and third circuit means and being adapted to receive the input signal for producing at an output thereof said output signal, said output signal being produced during the total time interval that the charge storage device is being discharged to said predetermined value.

11. The circuit of claim 10 wherein said gate means includes:

AND gate means having first and second input terminals and an output terminal, said first input terminal being adapted to receive the input signal, said output terminal being coupled to said second circuit means;

OR gate means having first and second input terminals and an output terminal, said first input terminal being coupled to said output terminal of said AND gate means, said second input terminal being coupled to an output of said third circuit means, said output terminal being coupled to said second input of said AND gate means; and inverter means having input and output terminals, said input terminal being connected to said output terminal of said OR gate means, said output terminal being adapted to be said output of the timing circuit.

12. The circuit of claim 11 wherein said second circuit means includes:

a first transistor having first, second and control electrodes, said first electrode being connected to a first potential level, said control electrode being coupled to said output terminal of said AND gate means;

first constant current source means for providing a current of a first predetermined value, the output of said first current source means being coupled to said second electrode of said first transistor;

a first diode having first and second electrodes, said first electrode being connected to said first potential level, said second electrode being connected to said second electrode of said first transistor; and a second transistor having first, second and control electrodes, said first electrode being connected to said first potential level, said control electrode being coupled to said second electrode of said first transistor, said second electrode being adapted to be connected to a first terminal of the charge storage device, the charge storage device having a second terminal connected to said first potential level.

13. The circuit of claim 12 wherein said first circuit means includes a second constant current source the output of which is adapted to be connected to said first terminal of the charge storage device for providing a current of a second predetermined value.

14. The circuit of claim 13 wherein said third circuit means includes:

a transistor having first, second and control electrodes, said first electrode being adapted to be connected to said first terminal of the charge storage device, and control electrode being coupled to a source of operating potential;

diode means coupled between said control electrode of said transistor of said third circuit means and said first potential level;

turn around circuit means coupled between said second electrode of said transistor of said third circuit means and said source of operatng potential, said turn around circuit means having an output terminal adapted to be connected to a second external charge storage device;

current source means connected between said output terminal of said circuit means and said first potential level;

comparator means operatively coupled between said output of said turn around circuit means and said second input terminal of said OR gate means for providing an output signal when the value of the output signal appearing at said output of said turn around circuit means is of a predetermined value with respect to a reference potential supplied to said comparator means; and said predetermined value of said current provided by said first constant current source being three times the magnitude of said predetermined value of said current provided by said second constant current source.

* * * * *